United States Patent [19]

Poticha et al.

[11] 4,090,126
[45] May 16, 1978

[54] FREQUENCY MARKER GENERATOR

[76] Inventors: Charles Poticha, 5516 W. 139th St., Hawthorne, Calif. 90250; Andrew K. Laird, 6317 Esplanade, Playa del Rey, Calif. 90291

[21] Appl. No.: 722,453

[22] Filed: Sep. 13, 1976

[51] Int. Cl.² .................................. G01R 27/00
[52] U.S. Cl. .......................... 324/57 SS; 324/78 Z; 324/79 R; 324/82; 328/134; 328/141; 328/148; 328/163
[58] Field of Search ............. 324/57 SS, 57 H, 78 E, 324/78 Z, 79 R, 82; 328/134, 141, 147, 148, 149, 163

[56] References Cited

U.S. PATENT DOCUMENTS

| | | | |
|---|---|---|---|
| 2,143,094 | 1/1939 | Swift | 324/57 H |
| 2,820,143 | 1/1958 | D'Nelly et al. | 328/134 |
| 2,843,662 | 7/1958 | Rieke | 328/163 X |
| 3,030,582 | 4/1962 | Holcomb et al. | 328/134 X |
| 3,136,900 | 6/1964 | Bell | 324/78 Z X |
| 3,164,777 | 1/1965 | Guanella | 324/82 X |
| 3,187,195 | 1/1965 | Stefanov | 324/79 R |
| 3,386,037 | 5/1968 | Yamada | 328/134 |
| 3,422,362 | 1/1969 | West | 328/134 |
| 3,432,752 | 3/1969 | Frederickson et al. | 324/57 SS |
| 3,513,400 | 5/1970 | Russell | 328/147 |

Primary Examiner—Stanley T. Krawczewicz
Attorney, Agent, or Firm—Nilsson, Robbins, Dalgarn, Berliner, Carson & Wurst

[57] ABSTRACT

A frequency marker generator for providing marker pulses corresponding to known frequencies over a wide band of frequencies is disclosed. A signal having a predetermined frequency or known frequency as well as the output unknown frequency or frequencies of the signals from a system under test are both applied to a phase and frequency detector. A sweep generator provides a signal which is variable in frequency over the frequency band of interest, and is applied to the system under test. The phase and frequency detector having two discrete output states provides a transition of its output state when the variable frequency output signal from the system under test passes the predetermined frequency and a differentiator differentiates the output signal from the phase and frequency detector and transmits it through a pair of steering diodes to provide a frequency marker signal which may be recorded separately or mixed in a mixer with the output of the system under test to provide a display of the amplitude versus frequency of the system under test at the predetermined frequency or frequencies.

31 Claims, 16 Drawing Figures

FREQUENCY MARKER GENERATOR

BACKGROUND OF THE INVENTION

The present invention relates to a frequency marker generator and more particularly to a system for providing frequency marker pulses over a wide band of frequencies.

Various prior art devices have been used to provide frequency marker pulses. In such devices, the frequency marker pulses are provided by inductively or capacitively inserting fixed known frequency signals or mixing the signals having known frequencies with the high frequency sweeps to produce heterodyne beats. These methods are typically used for providing frequency marker pulses corresponding to high frequencies over band widths wherein the ratio of the highest frequency in the band width to the lowest frequency in the band width is in the order of 2 or 3 to 1.

These techniques however provide frequency marker pulses having numerous harmonic beats having frequencies which are multiples of the fundamental frequency of the frequency marker pulse. Thus, the prior art devices cannot be used for providing frequency marker pulses wherein the band width includes frequencies which are both the fundamental and harmonic frequencies of any of the frequency marker pulses. Thus, the prior art devices are not usable to provide frequency marker pulses to test systems wherein the ratio of the highest frequency in the band width to the lowest frequency in the band width is substantially higher than 3.

High fidelity amplifier systems operate in the audio spectrum of frequencies with the band width having frequencies between approximately 20 hertz and 20 kilohertz thereby having a ratio of the highest frequency in the band width to the lowest frequency in the band width of approximately 1000. Therefore prior art marker pulse devices would provide many harmonic or beat pulses in the audio band width or any other band width of interest. It has become necessary to test audio equipment such as tape recorders and cassette and cartridge devices for amplitude response at predetermined frequencies and such prior art devices cannot provide any accurate testing in view of the harmonic marker pulse problem.

SUMMARY OF THE INVENTION

The present invention provides frequency marker pulses over a wide band of frequencies while avoiding any harmonic pulses of the frequency marker pulses or spurious responses. To attain this, a signal having a fixed predetermined frequency is applied to a phase and frequency detector and a sweep generator provides a sweep of signals over the frequency band of interest to a system under test such as a tape recorder or cartridge device and the output of the system under test is also applied to the phase and frequency detector. When the frequency of the output signal from the system under test passes the predetermined known frequency, the phase and frequency detector provides a transition in its output state.

A differentiator is coupled to the output of the phase and frequency detector to differentiate the output signal from the phase and frequency detector to provide a sharp marker pulse in response to the rapid transition in output state from the phase and frequency detector.

If the signals provided by the sweep generator increase in frequency and subsequently decrease, the marker pulses transmitted from the differentiator will have alternate opposite polarities. If it is desired to adjust the polarity of the marker pulses to provide a uniform polarity for all pulses, the differentiator may be coupled to a pair of steering diodes for providing marker pulses having the same polarity.

The marker pulses may then be recorded by any suitable recording device or mixed with the output signals from the system under test to provide an indication of the amplitude of the output of the system under test at the predetermined frequency associated with the marker pulse.

A visual display of the output of the system under test at the predetermined frequency may be obtained by demodulating the output of the system under test with an envelope detector for providing a wave form of the envelope of the system under test. The envelope wave form is then mixed with the marker pulse and displayed on any suitable visual display means such as an oscilloscope. A viewer may thereby clearly observe the amplitude of the output of the system under test and the marker pulse to provide visual indications of the amplitude of the output of the system at the frequency associated with the marker pulse.

A plurality of frequency marker signals may be provided by a plurality of channels each comprising a reference frequency generator for providing a signal having a predetermined frequency applied to a phase and frequency detector with a sweep generator providing a sweep signal to a phase and frequency detector. Each channel is provided with a differentiator coupled to the output of the associated phase and frequency detector to provide a separate marker pulse corresponding with the frequency of the associated reference frequency generator. The marker pulse of each channel may be mixed with the output of the system under test to thereby provide an indication of the amplitude of the output of the system under test at the different frequencies each associated with one of the channels.

An object of the invention is therefore to test a system by marking the amplitude of the output with marker pulses associated with one or more predetermined frequencies to observe the amplitude of the output at the frequency associated with the marker pulse. The invention is particularly useful for testing devices which operate in the audio frequency range such as cartridge devices. Cartridge devices in particular are used extensively in the broadcasting industry and different cartridge devices frequently provide different amplitude responses at the same frequency. It is therefore necessary to adjust each new cartridge device to provide uniform amplitude responses.

Other audio devices which may be tested using the present invention include tape and cassette recorders. These recorders may be tested by recording a signal from a variable sweep generator and playing back the variable frequency signal and applying it to the phase and frequency detector. The output of the recorder under test may also be applied through the envelope detector to the mixer which mixes the frequency marker pulses with the envelope of the amplitude of the output signal from the recorder under test. The composite signal may then be displayed on any suitable visual display means such as an oscilloscope or an X-Y plotter or strip chart recorder.

Another object of the present invention is to test cartridges for determining the amplitude response at predetermined frequencies after the cartridge has been recorded and used for a period of time. This testing is necessary to determine whether the recorded cartridge continues to meet the desired level of quality or it should be taken out of use. This testing of the cartridge may be achieved by recording various test tones at known amplitudes over a range of frequencies. The cartridge tape may be played back and the output of the playback signal is applied to the phase and frequency detector and through the envelope detector to the mixer. The amplitude of the output signal from the cartridge may then be observed at the frequencies corresponding to the frequency marker pulses to thereby test the cartridge for proper amplitude response at these predetermined frequencies.

A further object of the present invention is to test a system to determine whether the frequency range of the output signals includes a predetermined known frequency and desirable amplitude versus frequency characteristics. The output of the system under test may be mixed with the frequency marker pulses to determine if the frequency range of the output includes one of the frequency marker pulses.

Obviously, many modifications and variations of the present invention are possible in light of the above teachings. For example the spectrum of frequency in which the system operates is unlimited.

Other objects, advantages and novel features of the present invention will therefore become apparent from the following detailed description of the invention.

DETAILED DESCRIPTION

Figure 1:
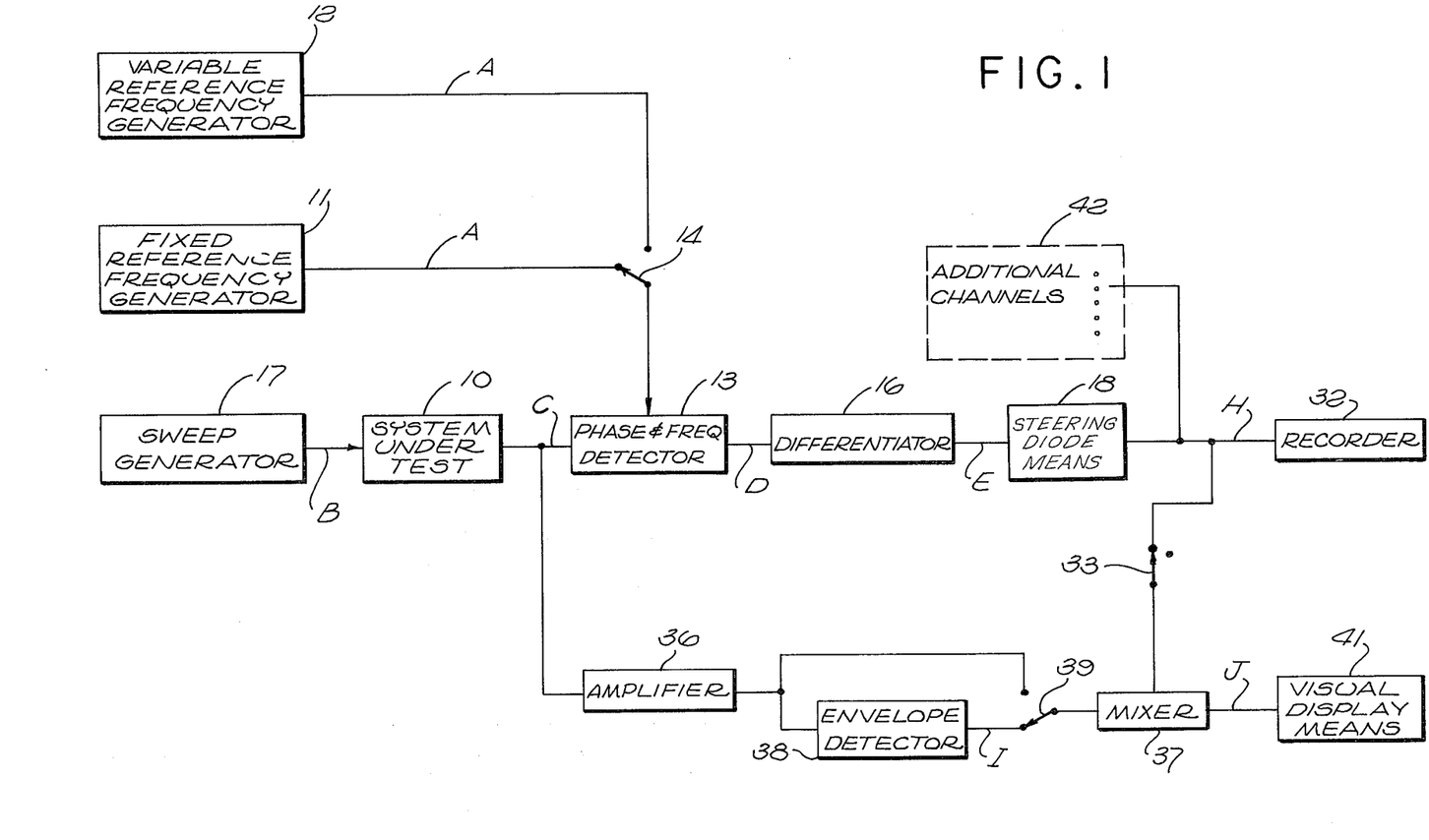
FIG. 1 is a block diagram of the preferred embodiment of the present invention.

As shown in FIG. 1, the frequency marker system of the present invention produces frequency marker signals at the output of a system under test 10. A reference frequency generator means provides a signal having a predetermined frequency. A phase and frequency detector 13 is coupled to the output of both the reference frequency generator and the output of the system under test 10 to compare the frequency from the reference frequency generator with the output of the system under test to provide a signal which may be used to generate a marker pulse. The marker pulse may be mixed with the output of the system under test 10 to observe the amplitude of the output of the system 10 at the frequency corresponding to the marker pulses. Although in the embodiment shown in FIG. 1, the marker pulses are mixed with the output of the system under test 10 to provide post-injection mode of operation, the marker pulses may be applied to the input of the system under test, as will be explained more fully in conjunction with the embodiment shown in FIG. 5, to provide pre-injection mode of operation. The present invention avoids harmonics or spurious signals of frequency marker pulses so that in the bandpass of interest, the ratio of the highest frequency to the lowest frequency is unlimited. Further, the frequency domain in which the present invention can be used is unlimited.

In the preferred embodiment the reference frequency generator means includes a fixed reference frequency generator 11 for providing a fixed reference frequency signal and a variable reference frequency generator 12 for providing variability in the reference frequency. A switch 14 is provided which may be manually adjusted to select either the fixed reference frequency generator 11 or the variable reference frequency generator 12.

The phase and frequency detector essentially compares the predetermined frequency from the reference frequency generator with the frequency from the system 10 and provides a transition in the binary output state when the frequency from the system under test state passes the reference frequency generator. The phase and frequency detector is therefore essentially a frequency comparator and may be any suitable device for providing this functon such as the type manufactured by Motorola in series HEP C 3806 P and MC4344 which is adapted to be used in the present invention to provide open loop asynchronous systems applications. The phase and frequency detector is therefore not locked into the frequency of the reference frequency generator, the sweep generator nor any other signal source.

The output of the signal from the system under test is processed in a manner well known in the art to provide a usable signal to the phase detector. This may be achieved by coupling a zero-crossaver detector (not shown) to the output of the system under test and a Schmitt trigger (not shown) to the output of the zero-crossaver detector to provide wave-shaping for greater accuracy and wide dynamic range of signal amplitude applied to the phase and frequency detector. Similar circuitry well known in the art may be coupled between the output of the reference frequency generator and the input of the phase and frequency generator to expand the variety of waveforms acceptable to the phase and frequency detector.

The output of the phase and frequency detector 13 is applied to the input of differentiator 16 which provides a discrete sharp marker pulse in real time in response to the digital transition in the output state from the phase and frequency detector 13.

Figure 3:
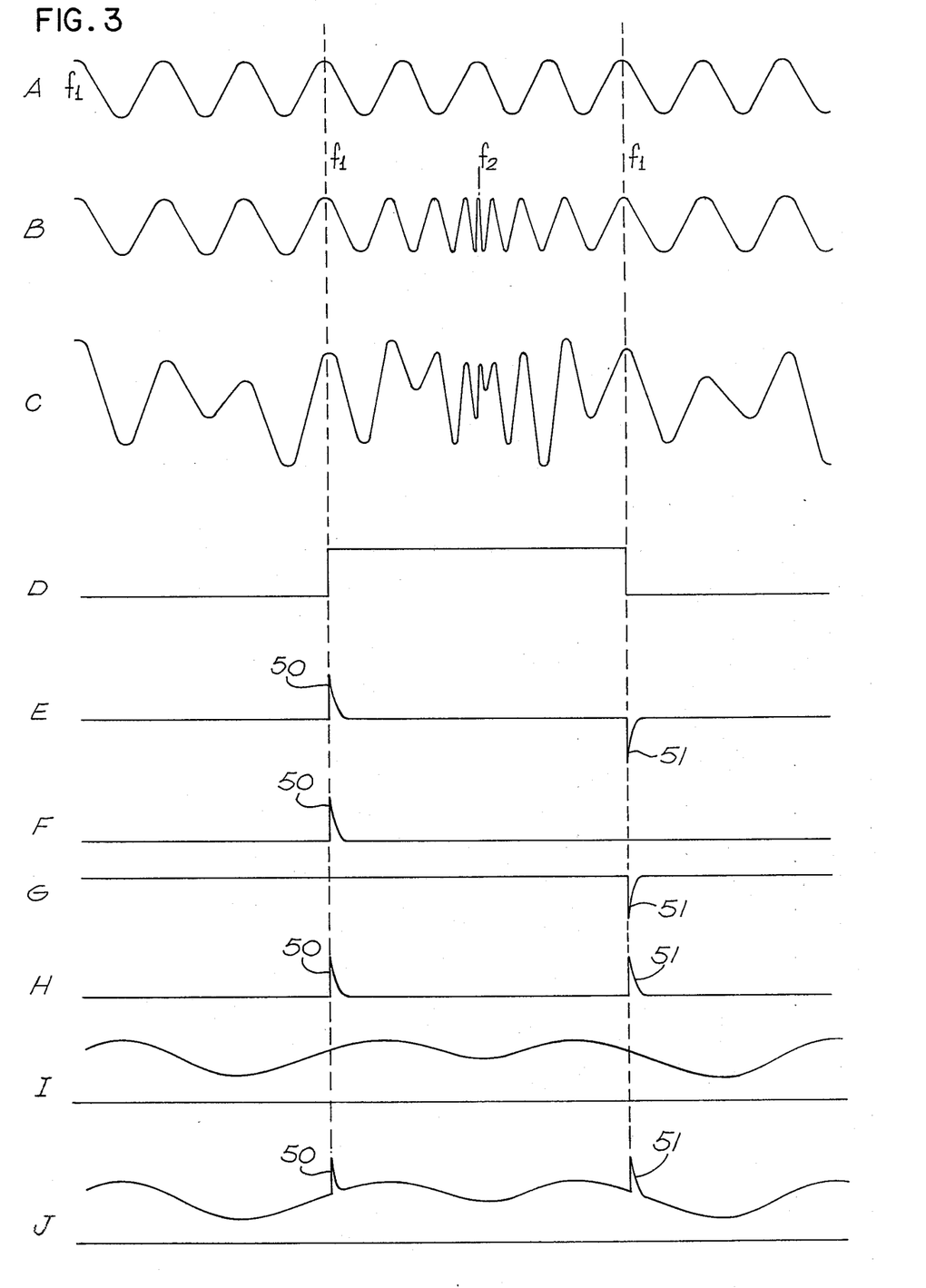
FIGS. 3A through 3J are timing diagrams of the present invention.

A sweep generator 17 is coupled to the system 10 to provide a sweep signal having a frequency which varies over the range of frequencies in which the system 10 is sought to be tested. The frequency of the output signal of the sweep generator 17 may follow any predetermined function and in the preferred embodiment, the frequency increases linearly with respect to time and subsequently decreases as shown in FIG. 3B. This causes the frequency marker pulses from the differentiator 16 to have alternate opposite polarities as shown in FIG. 3E. Steering diode means 18 is therefore coupled to the output of the differentiator 16 for providing marker signals each having the same polarity.

Figure 2A:
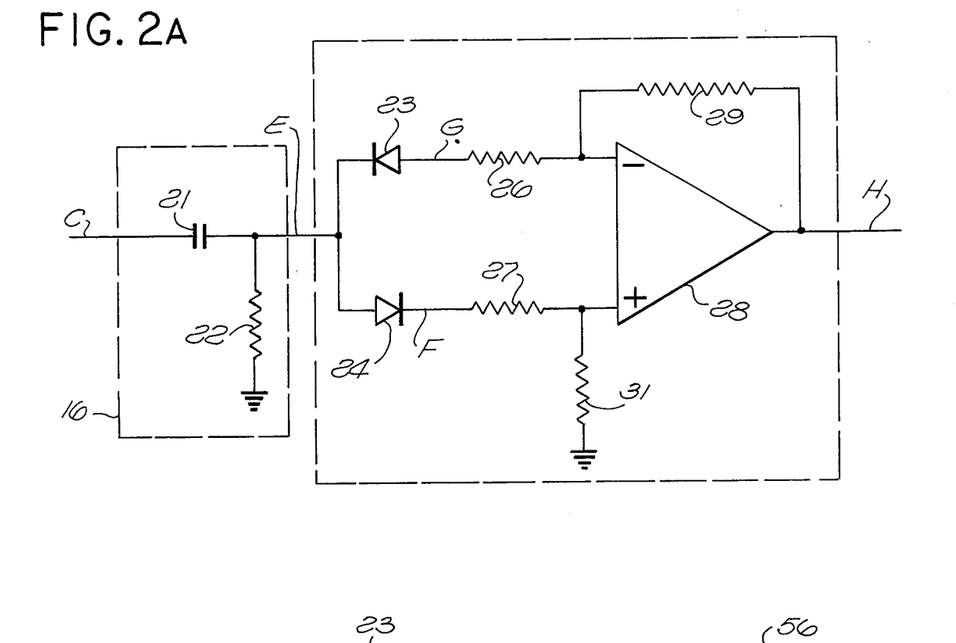
FIG. 2A is a schematic diagram of the differentiator and steering diodes circuits of the present invention.

The differentiator 16 and steering diode means 18 are shown schematically in FIG. 2A. The differentiator includes a capacitor 21 and resistor 22 for providing an output signal which represents the rate of change of the input voltage with respect to time. The differentiated signal is applied to diodes 23 and 24 which transmit the differentiated signal through associated resistors 26 and 27 as shown.

The cathode of diode 23 is coupled to the output of the differentiator 16 and the anode is coupled through resistor 26 to the negative input terminal of an amplifier 28 as shown. Similarly, the anode of diode 24 is coupled to the output of the differentiator 16 and the cathode is coupled through resistor 27 to the positive input of the amplifier 28. The amplifier 28 is provided with a feedback resistor 29 and a resistor 31 for providing an input voltage to the positive terminal. The frequency marker pulses may be applied to a recorder 32 to provide a recordation of the marker pulses.

The use of the recorder 32 is particularly useful when the system is used to determine whether signals in a band of frequencies include the predetermined frequency generated by the reference frequency generator as well as the amplitude and frequency characteristics of the system. A recordation of a marker pulse on recorder 32 indicates that the frequency of the swept signal includes the predetermined frequency associated with the frequency marker pulse. Correspondingly, the failure of recorder 32 to record any marker pulse indicates that the band of frequencies of the swept signal does not include the frequency of the marker pulse.

The frequency marker pulses may be coupled to a mixer 37 through a suitable switch 33 which mixes them with the output of the system under test 10 for mixing the signals. The output of the system under test 10 may be applied through a suitable amplifier 36 to mixer 37 either directly or demodulated through an envelope detector 38. The mixer 37 may be any suitable signal mixer which combines the frequency marker pulses as well as the output of the system under test 10 and the envelope detector 38 may be coupled between the amplifier 36 and the mixer 37 by a switch 39. The envelope detector 38 may be any suitable demodulator for providing a wave form corresponding to the amplitude of the system under test 10.

The mixer 37 may be coupled to a suitable visual display means 41 for providing a composite visual display of the amplitude of the output of the system under test and the marker pulses to enable a viewer to determine the amplitude at the frequency corresponding to the marker pulses. Although the visual display means 41 is preferably an oscilloscope, it may be any suitable visual recording device such as an X-Y recorder or a strip chart recorder.

The present invention may be adapted for providing a plurality of frequency marker signals each provided by a separate channel. Each channel comprises a reference frequency generator such as fixed reference frequency generator 11 or variable reference frequency generator 12. Each channel also includes means for providing a sweep signal having a frequency which varies over a band of frequencies which may be provided by a sweep generator such as sweep generator 17. A phase and frequency detector such as phase and frequency detector 13 is coupled to the output of the reference frequency generator means and the means for providing the sweep signal. The phase and frequency detector is operative to provide a transition in its output state when the frequency of the sweep signal passes the reference frequency. The marker pulses are differentiated by a differentiator 16 and may be applied directly to a mixer such as mixer 37 or through steering diode means 18 to provide frequency marker signals having the same polarity.

Figure 2B:
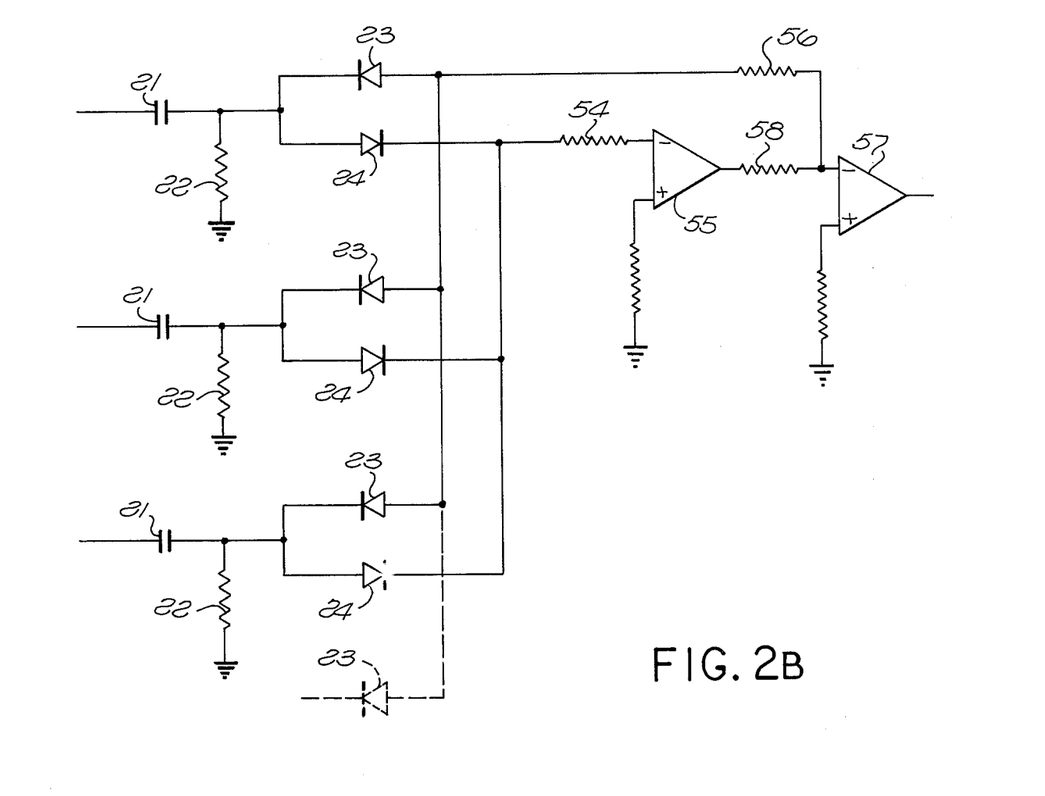
FIG. 2B is a schematic diagram of the differentiator and steering diodes circuits of several channels coupled to the same amplifier circuit.

The steering diodes 23 and 24 of each of the channels may be coupled as shown in FIG. 2B to a single circuit means, shown as including amplifiers 55 and 57, to reduce the total number of amplifiers used.

The cathodes of all the diodes 24 are coupled through an input resistor 54 to the negative input of amplifier 55 and the anodes of all the diodes 23 are coupled through a resistor 56 to the negative input of an amplifier 57. The output of the amplifier 55 is coupled through a summing resistor 58 to the input of amplifier 57. The output of the amplifier 57 thereby provides marker pulses having the same polarity.

Additional channels 42 provide frequency marker pulses each corresponding to a different frequency and all the marker pulses are applied to the mixer 37. The sweep generator 17 of each channel is applied to the input of a system under test 10 and the output of the system is coupled to the phase and frequency detector 13 of each channel. The output of the system 10 is also coupled to the mixer 37 for combining the marker pulses from all of the channels with the output of the system 10. The switch 39 may be switched to select the demodulated output of the system 10 from the envelope detector 38 to provide a wave form corresponding to the envelope of the output of the system 10 which is mixed in the mixer 37 with the marker pulses to enable the visual display means 41 to provide a signal on a display, such as an oscilloscope, of the output wave form of the system under test and all of the marker pulses corresponding to the reference frequency associated with each individual channel.

Although the output of each channel is shown in FIG. 1 coupled to the output of the system under test 10 for post-injection of frequency marker pulses, it will be apparent that the output of each channel may be coupled to the input of the system under test 10 for preinjection of frequency marker pulses. This may be achieved by simply decoupling the output of system 10 from the input of phase and frequency detector 13 and coupling the output of each channel to the input of the system 10 as will be explained more fully in conjunction with the embodiment shown in FIG. 5.

Referring to the timing diagram shown in FIGS. 3A through 3J, the reference frequency signal provided by either the fixed reference frequency generator 11 or the variable reference frequency generator 12 is shown in FIG. 3A having a constant frequency $f_1$ and a constant amplitude. The sweep generator 17 provides a sweep signal having a constant amplitude and a frequency which varies in accordance with some predetermined function. In FIG. 3B, the output signal from sweep generator 17 is shown increasing linearly with respect to time past frequency $f_1$ to frequency $f_2$ and then decreasing linearly with respect to time past $f_1$ as shown in FIG. 3B.

The output of the system under test 10 therefore has an amplitude which is a function of the frequency of the input wave form B and provides a wave form shown in FIG. 3C. Since the wave form B is symmetrical with respect to time around the peak frequency $f_2$, the wave form shown in FIG. 3C will also be symmetrical with respect to the point in time at which the input wave form B has a frequency of $f_2$.

The wave form C is applied to the phase and frequency detector which has two discrete output states shown in FIG. 3D. The phase and frequency detector provides a transition in its output state when the frequency of the wave form C from the system under test 10 passes the fixed reference frequency shown in FIG. 3A. Thus, as shown in FIG. 3D, the output of the phase and frequency detector 13 provides a transition from one discrete low voltage state to a second discrete high voltage state and subsequently a transition from the high voltage state to the low voltage state with the length of the pulse shown in FIG. 3D being symmetrical with respect to the point of time at which the wave form shown in FIG. 3B has a frequency $f_2$.

The wave form shown in FIG. 3D is differentiated by differentiator 16 to provide the wave form shown in FIG. 3E. The pulse 50, shown in FIG. 3E represents the rate of change of the wave form shown in FIG. 3D with respect time during a transition from low voltage to high voltage. Correspondingly, the pulse 51 shown in FIG. 3E represents the differentiation of the wave form shown in FIG. 3D during a transition from high voltage state to low voltage state. The reason for the opposite polarities of pulses 50 and 51 is that as the frequency of the wave form B increases linearly, the wave form D goes from a low transition to a high transition when the frequency of the wave form B increases past $f_1$. Correspondingly as the frequency of the wave form B decreases linearly, the wave form D goes from a high transition to a low transition when the frequency of the wave form B decreases past $f_1$ transition. Hence, the pulses 50 and 51 represent time changes of the wave form D in opposite voltage directions. If the sweep generator 17 provided a sweep signal having a constantly increasing frequency without any decrease in frequency after reaching the frequency $f_2$, the output pulses E provided by the differentiator 16 would all have the same polarity.

In order to provide marker pulses of uniform polarity, the output wave form E from the differentiator 16 may be applied to the steering diodes 23 and 24 which, as shown in FIG. 2A, are coupled to provide a wave form shown in FIGS. 3F and 3G. The negative marker pulses 51 are transmitted through the diode 23 to negative input terminal of an amplifier 28 which inverts the polarity of the negative marker pulse 51 while retaining the positive polarity of the positive marker pulse 50 to thereby provide pulses of uniform polarity shown in FIG. H.

The output signal C from the system under test 10 may also be transmitted through the envelope detector 38 which demodulates the output signal C, to provide an envelope signal shown in FIG. 3I.

The mixer 37 mixes the frequency marker pulses 50 and 51 with the envelope signal shown in FIG. 3I to provide an indication of the amplitude of the output signal from the system under test 10 at the frequency $f_1$. The composite wave form of the frequency marker pulses and the envelope of the output signal from the system under test 10 is shown in FIG. 3J and may be viewed by any suitable display means 41 such as an oscilloscope or recorded by any suitable recording device.

It will be apparent that although the frequency from the sweep generator 17 is shown in FIG. 3B to increase linearly with respect to time until it reaches frequency $f_2$ and subsequently decrease linearly with respect to time, the frequency of the wave form may vary in accordance with any predetermined function such as a linear increase in frequency with respect to time or a logarithmic change in frequency with respect to time.

The frequecny may even be random noise. However, for this application, a variable narrow band pass filter must be coupled somewhere between the noise generator and the phase and frequency detector. Furthermore, although the amplitude of the sweep frequency signal is shown as being constant, the amplitude may have any shape to check the system under test.

Figure 4:
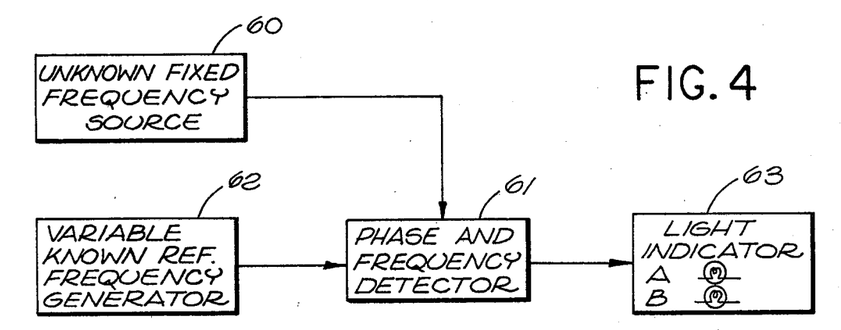
FIG. 4 is a block diagram of an embodiment of the present invention used to determine the frequency of an unknown fixed frequency.

The present invention may be used to determine the frequency of an unknown fixed frequency. As shown in FIG. 4, a signal having unknown fixed frequencies are provided by unknown fixed frequency source 60 which transmits a fixed frequency signal to the phase and frequency detector 61. A variable known reference frequency signal is provided by variable known reference frequency generator 62 which is also coupled to the phase and frequency detector 61. The output of the phase and frequency detector is coupled to a suitable indicator such as light indicator 63 having lamps A and B. Lamp A is coupled to be lit with lamp B unlit, when the output of the phase and frequency detector 61 has one binary output state and lamp B is coupled to be lit, with lamp A unlit, when the output of the phase and frequency detector 61 is at its opposite binary state. It is noteworthy that the differentiator circuit is not needed in this embodiment of the present invention.

The frequency of the unknown fixed frequency may be determined by sweeping the variable known frequency over a band of frequencies until the variable known frequency passes the unknown frequency. At this point of time one of the lamps which was previously on will turn off and the other lamp which was previously off, will be lit thereby indicating to the user that the unknown fixed frequency is the same as the variable known reference frequency.

Although the light indicator 63 is suitable for such an application of the present invention, it will be apparent that the indicator may be any suitable indicator such as an oscilloscope or recording device. Alternatively, a meter indicator may be used having a needle which points to one predetermined location when the variable known reference frequency is below the unknown fixed frequency and points to a second meter location when the variable known reference frequency is above the unknown fixed frequency.

Figure 5:
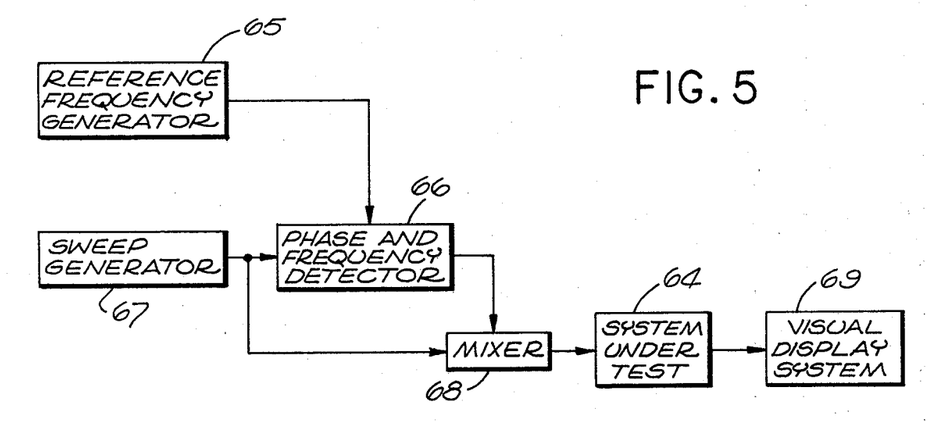
FIG. 5 is a block diagram of an embodiment of the present invention adapted for preinjection of frequency marker pulses.

Although the embodiment shown in FIG. 1 provides for post injection of frequency marker pulses to the output of the system under test, the present invention may be adapted for pre-injection of frequency marker pulses to the input of the system under test. As shown in FIG. 5, the reference frequency generator 65 shown therein provides a fixed reference frequency signal to the phase and frequency detector 66 and the sweep generator 67 provides a sweep signal to the input of the phase and frequency detector 66 as well as the mixer 68. Thus the mixer 68 provides an output sweep signal and a marker signal generated when the frequency of the output of the sweep generator 67 passes the frequency of the reference frequency generator 65. It is noteworthy that the mixer 68 may be constructed to provide output signals without the necessity of the differentiator coupled to the output of the phase and frequency detector shown in the embodiment of FIG. 1.

The combined sweep generator signals and frequency marker pulses from the output of the mixer 68 are then applied to the input of a system 64 for pre-injection mode of operation. The output of the system 64 may be transmitted to a visual display system 69 to provide a visual display of the amplitude of the output of the system under test 64 with frequency marker pulses corresponding to the frequency of the output signal of the reference frequency generator 65. Alternatively, the system 64 may record the frequency marker pulse and the sweep signal in a suitable storage device for playback at some future time.

Another application of the present invention is in the analysis of stored data. The stored data can be analyzed at a time subsequent to the storage thereby obviating the necessity of a sweep generator.

Figure 6:
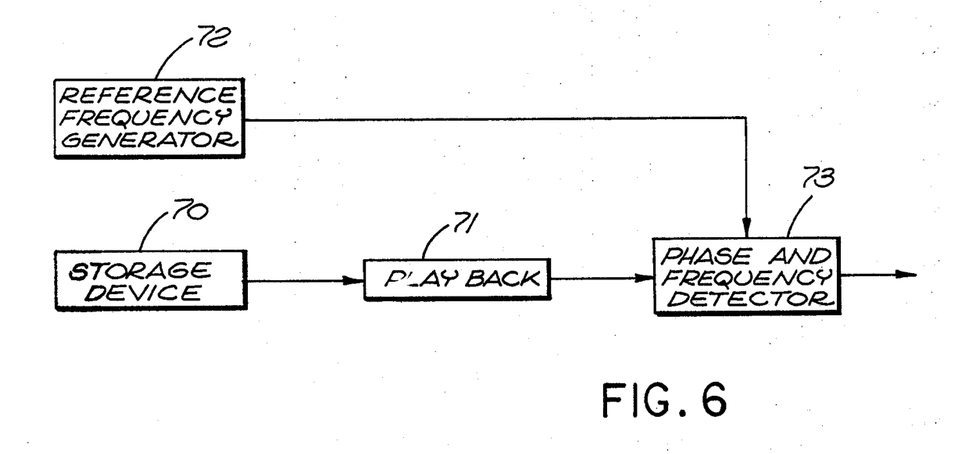
FIG. 6 is a block diagram of an embodiment of the present invention adapted to analyze stored data.

As shown in FIG. 6, a storage device may be used to store data which may be subsequently played back by a playback unit 71. A reference frequency 72 provides a reference frequency signal which is applied to the phase and frequency detector 73 which, as shown, also receives the input from the playback 71. The phase and frequency detector provides a transition in output state to any suitable display when the frequency of the output signal from the storage device 70 passes the fixed reference frequency of the signal generated by the reference frequency generator 72.

The storage device may be any magnetic tape recorder, wire recorder, light pattern recorder or photographic film recorder or other photo-sensitive device. Alternatively, it may be a data storage device which stores digitized analog signals in a memory bank such as a matrix or storage drum.

It is noteworthy that in this embodiment, there is no need for a sweep generator since the signals generated by this storage device 70 are swept in the course of storage in the storage device. The output signals from the storage device 70 are therefore automatically swept when transmitted to the playback device 71. Furthermore, the phase and frequency detector need only provide a transition in output state and need not be differentiated before being applied to a display device or other recorder.

Obviously, many modifications and variations of the present invention are possible in light of the above teachings. For example, although several of the applications of the present invention are in the audio spectrum of frequencies, it should be understood that the spectrum of frequencies in which the present invention can be used is unlimited. It is, therefore, to be understood that within the scope of the appended claims, the invention can be practiced otherwise and as specifically described.

We claim:

1. A frequency marker system for providing frequency marker signals to the output of a system under test comprising:
   reference frequency generator means for providing a signal having a predetermined frequency,
   phase and frequency detector means coupled to the output of said reference frequency generator means and the system under test, said phase and frequency detector means having two discrete output states, and being operative to provide a transition in output state when the frequency of the output of the signal from the system under test passes the predetermined frequency, and
   differentiator means coupled to the output of said phase and frequency detector means and being operative to provide a marker signal in response to the transition in the output state of said phase and frequency detector means.

2. The system as described in claim 1 and further including
   mixer means coupled to the output of said differentiator means and the output of the system under test for combining the frequency marker pulses with the output of the system under test for providing a marker pulse at the output of the system under test at the predetermined frequency.

3. The system as described in claim 2 and further including visual display means coupled to the output of said mixer means for providing a visual display of the amplitude output of the system under test and the marker pulses at the predetermined frequency.

4. The system as described in claim 2 and further including envelope detector means coupled between the output of the system under test and said mixer means for providing an output wave form which is the envelope of the output signal of the system under test.

5. The system as described in claim 4 and further including visual display means coupled to the output of said mixer means for providing a visual display of the amplitude of the output of the system under test and the marker pulses at the predetermined frequency.

6. The system as described in claim 1 and wherein said differentiator means provides a marker signal having a first polarity when the frequency of the system under test increases past the predetermined frequency and a marker signal having a second opposite polarity when the frequency of the system under test decreases past the predetermined frequency and further including
   steering diode means coupled to the output of said differentiator means for providing marker signals having the same polarity.

7. The system as described in claim 1 and further including sweep generator means coupled to the system under test for providing a sweep signal having a frequency which varies over the range of frequencies within which the system under test is sought to be tested.

8. The system as described in claim 7 and wherein the frequency of the sweep signal increases and decreases in a predetermined sequence and further including
   steering diode means coupled to the output of said differentiator means for providing marker signals having the same polarity.

9. The system as described in claim 1 and further including steering diode means coupled to the output of said differentiator means for providing marker signals having the same polarity, said steering diode means including a pair of diodes each having a cathode and an anode terminal, with the first diode of said pair of diodes having a cathode coupled to the output of said differentiator means and the second diode of said pair of diodes having an anode coupled to the output of said differentiator means.

10. The system as described in claim 9 wherein said steering diode means further includes an amplifier having a negative input terminal coupled to the anode of said first diode and a positive input terminal coupled to the cathode of said second diode, said amplifier being operative to provide marker signals at its output having the same polarity.

11. A frequency coincidence detector system comprising:
   reference frequency generator means for providing a signal having a known predetermined frequency,
   sweep generator means for providing a sweep signal having an unknown variable frequency which varies over a band of frequencies, phase and frequency detector means coupled to the output of said reference frequency generator means and to the output of said sweep generator means, said phase and frequency detector means having two discrete output states and operative to provide a transition in its output state when the frequency of the sweep signal passes the predetermined frequency, and visual display means coupled to said phase and frequency detector means for providing a visual indication when the frequency of the sweep signal passes the predetermined frequency.

12. The system as described in claim 11 and further including differentiator means coupled between said phase and frequency detector means and said visual display means and operative to provide a marker signal in response to the transition in output state of said phase and frequency detector means when the frequency of the sweep signal passes the known predetermined frequency.

13. The system as described in claim 12 and wherein said sweep generator increases and decreases in the band of frequencies and further including, steering diode means coupled to the output of said differentiator means for providing marker signals having the same polarity.

14. The system as described in claim 11 wherein said reference frequency generator means includes a variable known reference frequency generator means for varying the signal having a known predetermined frequency.

15. The system as described in claim 11 wherein said reference frequency generator means includes a fixed reference frequency generator means for providing the signal having a known predetermined frequency.

16. The system as described in claim 14 wherein said reference frequency generator means further includes a fixed reference frequency generator means for alternatively providing the signal having a known predetermined frequency and further including:

an adjustable switch means for selecting either the fixed frequency generator means or the variable frequency generator means to provide the signal having a known predetermined frequency.

17. A system for providing a plurality of frequency marker signals each provided by a separate channel and including means for providing a sweep signal having a frequency which varies over a band of frequencies with each channel comprising:

reference frequency generator means for providing a signal having a constant predetermined frequency, phase and frequency detector means coupled to the output of said reference frequency generator means and said means for providing a sweep signal, said phase and frequency generator means having two discrete output states and being operative to provide a transition in its output state when the frequency of the sweep signal passes the constant predetermined frequency, and differentiator means coupled to the output of said phase and frequency detector means and being operative to provide a marker signal in response to the transition in output state of said phase and frequency detector means when the frequency of the sweep signal passes the constant predetermined frequency.

18. The system as described in claim 17 and wherein each channel is adapted to provide a frequency marker pulse to the output of a system under test and said means for providing a sweep signal is coupled to the input of the system under test and the output of the system under test is coupled to the input of said phase and frequency detector in each channel, and further including, mixer means coupled to the output of each of said channels and further coupled to the output of the system under test for combining the marker pulses with the output of the system under test.

19. The system as described in claim 18 and further including, an envelope detector means coupled between the output of the system under test and said mixer means for providing an output wave form which is the envelope of the output signal of the system under test, and visual display means coupled to the output of said mixer means for providing a visual display of the frequency marker signals and the envelope of the output wave form of the system under test.

20. The system as described in claim 17 and wherein each channel is adapted to provide a frequency marker pulse to a system under test and said means for providing a sweep signal in each channel is coupled to the system under test, and further including, mixer means coupled to the output of each of said channels and further coupled to the output of the system under test for combining the marker pulses with the output of the system under test.

21. The system as described in claim 20 and further including visual display means coupled to the output of said mixer means for providing a visual display of the amplitude of the output of the system under test and the frequency marker signals.

22. The system as described in claim 17 and wherein each channel further includes steering diode means coupled to the output of the associated differentiator means for providing frequency marker signals by the associated channel having the same polarity.

23. The system as described in claim 22 wherein the steering diode means of each channel includes circuit means included in the other channels for responding to the signals in all the channels.

24. A system for determining the frequency of an unknown fixed frequency signal provided by an unknown fixed frequency source comprising:

variable known reference frequency generator means for providing a variable reference frequency signal; and phase and frequency detector means coupled to the output of both said unknown fixed frequency source and said variable known reference frequency generator means, said phase and frequency detector means having two discrete output states and being operative to provide a transition in output state when the frequency of the output signal of the variable known reference frequency generator means passes the unknown fixed frequency.

25. The system as described in claim 24 and further including indicator means coupled to the output of said phase and frequency detector means for providing a visual indication of the transition of said phase and frequency detector means.

26. A frequency marker system for providing frequency marker signals to the input of a system under test comprising:

reference frequency generator means for providing a signal having a predetermined frequency;

sweep generator means for providing a sweep signal having a frequency which varies over a range of frequencies;

phase and frequency detector means coupled to the output of said reference frequency generator means and said sweep generator means, said phase and frequency detector means having two discrete output states and being operative to provide a transition in output state when the frequency of the output of the sweep generator passes the frequency of the reference frequency generator means;

said system under test being coupled to the output of said phase and frequency detector means and said sweep generator means, said coupling enabling said system to receive a signal corresponding to the frequency of the output of said reference frequency generator means and the output of said sweep generator means.

27. The system as described in claim 26 and further including mixer means coupled between the output of said phase and frequency detector means and said system under test, said mixer means being further coupled between said sweep generator and said system under test for providing a signal to said system under test having a variable frequency and a marker pulse at the predetermined frequency.

28. A system for providing a discrete signal associated with a predetermined fixed frequency comprising:

reference frequency generator means for providing a signal having a fixed frequency;

signal generator means for providing a signal having a frequency which varies over a range of frequencies;

phase and frequency detector means operating in the open loop asynchronous mode and coupled to the output of said reference frequency generator means and said signal generator means, said phase and frequency detector means having two discrete output states and being operative to provide a transition in output state when the frequency of the output signal from the signal generator means passes the predetermined frequency.

29. The system as described in claim 28 and further including differentiator means coupled to the output of said phase and frequency detector means and being operative to provide a marker signal in response to the transition in the output state of said phase and frequency detector means.

30. A frequency marker system for providing a frequency marker signal to a prerecorded signal comprising:

reference frequency generator means for providing a signal having a predetermined frequency;

storage means for storing a plurality of signals;

phase and frequency detector means coupled to the output of said reference frequency generator means and the output of said storage device, said phase and frequency detector means having two discrete output states and coupled to operate in the asynchronous mode, and being operative to provide a transition in output state when the frequency of the output of the signal from the storage device passes the predetermined frequency of the reference frequency generator.

31. The system as described in claim 30 and wherein said storage device includes recording means for storing a plurality of recorded signals and further including:

playback means coupled between the output of said storage device and the input of said phase and frequency detector means for retrieving said recorded signals from said storage device and playing them to be applied to the input of said phase and frequency detector means.

* * * * *